United States Patent [19]
Park

[11] Patent Number: 5,573,968
[45] Date of Patent: Nov. 12, 1996

[54] METHOD FOR FABRICATING STACKED CAPACITORS OF SEMICONDUCTOR DEVICE

[75] Inventor: Young J. Park, Kyoungki-do, Rep. of Korea

[73] Assignee: Hyundai Electronics Industries Co., Ltd., Kyoungki-do, Rep. of Korea

[21] Appl. No.: 606,199

[22] Filed: Feb. 23, 1996

[30] Foreign Application Priority Data

Feb. 27, 1995 [KR] Rep. of Korea .................. 95-3907

[51] Int. Cl.$^6$ ............................ H01L 21/70; H01L 27/00
[52] U.S. Cl. .................. 437/52; 437/60; 437/919
[58] Field of Search .................... 437/47–48, 52, 437/60, 919; 148/DIG. 14; 257/306–310

[56] References Cited

U.S. PATENT DOCUMENTS

| | | | |
|---|---|---|---|
| 5,286,668 | 2/1994 | Chou | 437/52 |
| 5,403,767 | 4/1995 | Kim | 437/52 |
| 5,422,295 | 6/1995 | Choi et al. | 437/52 |

*Primary Examiner*—H. Jey Tsai
*Attorney, Agent, or Firm*—Nath & Associates; Gary M. Nath

[57] ABSTRACT

A method for fabricating capacitors of a semiconductor device, capable of forming a storage electrode provided at its side walls with irregularity providing an increased surface area in accordance with an etch process using a difference in etch selectivity between doped and undoped silicon films. The method includes forming doped and undoped amorphous conduction films in an alternating manner over a semiconductor substrate formed with a contact hole, thereby forming a first amorphous conduction layer having a multilayer structure, forming an insulating film pattern on the first amorphous conduction layer, forming undoped and doped amorphous conduction films in an alternating manner over the resulting structure, thereby forming a second amorphous conduction layer, etching the resulting structure under a condition that the insulating film pattern and lower insulating layer are used as an etch barrier, annealing the amorphous conduction layers, thereby forming crystallized conduction layers without diffusing an impurity, etching doped portions of the conduction layers, thereby providing an irregularity structure at the conduction layers, and doping impurity ions in undoped portions of the conduction layers, thereby forming a cylindrical storage electrode having the irregularity structure at each side wall thereof.

16 Claims, 4 Drawing Sheets

METHOD FOR FABRICATING STACKED CAPACITORS OF SEMICONDUCTOR DEVICE

BACKGROUND OF THE INVENTION

1. Field of the Invention

The present invention relates to a method for fabricating capacitors of a semiconductor device, and more particularly to a method for fabricating capacitors having an increased surface area in accordance with an etch process using a difference in etch selectivity ratio between doped and undoped layers in a highly integrated semiconductor device, thereby ensuring a high capacitance.

2. Description of the Prior Art

The recent high integration trend of semiconductor devices inevitably involves a reduction in cell dimension. However, such a reduction in cell dimension results in difficulty in forming capacitors having a sufficient capacitance. This is because the capacitance is proportional to the surface area of the capacitor.

In the case of a dynamic random access memory (DRAM) device including a metal oxide semiconductor (MOS) transistor and one capacitor, in particular, it is important to reduce the area occupied by the capacitor and yet obtain a high capacitance of the capacitor, for the high integration of the DRAM device.

For increasing the capacitance, various research has been conducted. For example, there have been known use of a dielectric material exhibiting a high dielectric constant, formation of a thin dielectric film, and formation of capacitors having an increased surface area, taking into consideration the fact that the capacitance of the capacitor is proportional to the area of the capacitor and inversely proportional to the thickness of the dielectric film constituting the capacitor.

However, all of these methods have their own problems. Although various materials, such as $Ta_2O_5$, $TiO_2$ or $SrTiO_3$, have been proposed as the dielectric material exhibiting a high dielectric constant, their reliance and thin film characteristics have not been confirmed. For this reason, it is difficult to use such dielectric materials for semiconductor devices in practical situations. The reduction in the thickness of dielectric film results in damage to the dielectric film severely affecting the reliance of the capacitor.

In order to increase the surface area of the capacitor, a cylindrical capacitor structure has also been proposed. Now, a method for fabricating such a cylindrical capacitor structure will be described.

In accordance with this method, a semiconductor substrate, which has a lower insulating layer, is prepared. A contact hole is then formed at the semiconductor substrate in accordance with an etch process using a contact mask so as to expose a desired portion of the semiconductor substrate. Over the resulting structure, a first conduction layer is formed. The first conduction layer is in contact with the semiconductor substrate through the contact hole. An oxide film pattern is then formed on the first conduction layer in accordance with an etch process using a storage electrode mask. Using the oxide film pattern as a mask, the first conduction layer is then etched. At this time, the lower insulating layer is used as an etch barrier. Over the resulting structure, a second conduction layer is deposited to a desired thickness. Subsequently, the second conduction layer is anisotropically etched, thereby forming second-conduction layer spacers respectively on the side walls of the oxide film. These spacers are in contact with the first conduction layer. Thereafter, the oxide film is removed, thereby forming a cylindrical storage electrode. At a subsequent step, a dielectric film and plate electrode are formed on the cylindrical storage electrode. Thus, a cylindrical capacitor is obtained. Using such a method, a capacitor having a plurality of cylinder structures can be formed. However, this method involves a difficulty to ensure a sufficient capacitance for highly integrated semiconductor devices.

SUMMARY OF THE INVENTION

Therefore, an object of the invention is to provide a method for fabricating capacitors of a semiconductor device, capable of forming a capacitor structure having a storage electrode with an increased surface area in accordance with an etch process using a difference in wet etch selectivity ratio, thereby obtaining a sufficient capacitance required for high integration of the semiconductor device.

In accordance with one aspect, the present invention provides a method for fabricating capacitors of a semiconductor device comprising the steps of: partially removing a lower insulating layer formed over a semiconductor substrate, thereby forming a contact hole, through which a desired portion of the semiconductor substrate is exposed; forming doped amorphous conduction films and undoped amorphous conduction films in an alternating manner over the resulting structure obtained after forming the contact hole, thereby forming a first amorphous conduction layer having a multi-layer structure such that the uppermost one of the doped amorphous conduction films constitutes an uppermost portion of the multi-layer structure; forming an insulating film pattern on the uppermost doped amorphous conduction film in accordance with an etch process using a storage electrode mask; forming undoped amorphous conduction films and doped amorphous conduction films in an alternating manner over the resulting structure obtained after forming the insulating film pattern, thereby forming a second amorphous conduction layer; etching the resulting structure obtained after forming the second amorphous conduction layer at its full surface by the total thickness of the first and second amorphous conduction layers under a condition that the insulating film pattern and lower insulating layer are used as an etch barrier; removing the insulating film pattern in accordance with a wet etch process; annealing the first and second amorphous conduction layers at a required temperature for a required time, thereby forming first and second crystallized conduction layers without diffusing an impurity; etching doped portions of the first and second crystallized conduction layers over a desired width in a wet etch process, thereby providing an irregularity structure at the first and second crystallized conduction layers; and doping impurity ions in undoped portions of the first and second crystallized conduction layers, thereby forming a cylindrical storage electrode having the irregularity structure at each side wall thereof.

In accordance with another aspect, the present invention provides a method for fabricating capacitors of a semiconductor device comprising the steps of: partially removing a lower insulating layer formed over a semiconductor substrate, thereby forming a contact hole, through which a desired portion of the semiconductor substrate is exposed; forming doped amorphous conduction films and undoped amorphous conduction films in an alternating manner over the resulting structure obtained after forming the contact hole, thereby forming a first amorphous conduction layer having a multi-layer structure such that the uppermost one of the doped amorphous conduction films constitutes an uppermost portion of the multi-layer structure; forming a plurality of insulating film patterns on the uppermost doped amorphous conduction film in accordance with an etch process using a storage electrode mask; forming undoped amorphous conduction films and doped amorphous conduction films in an alternating manner over the resulting structure obtained after forming the insulating film patterns, thereby forming a second amorphous conduction layer; etching the resulting structure obtained after forming the second amorphous conduction layer at its full surface by the total thickness of the first and second amorphous conduction layers under a condition that the insulating film patterns and lower insulating layer are used as an etch barrier; removing the insulating film pattern in accordance with a wet etch process; annealing the first and second amorphous conduction layers at a required temperature for a required time, thereby forming first and second crystallized conduction layers without diffusing an impurity; etching doped portions of the first and second crystallized conduction layers over a desired width in a wet etch process, thereby providing irregularity structures at the first and second crystallized conduction layers; and doping impurity ions in undoped portions of the first and second crystallized conduction layers, thereby forming multi-cylinder type storage electrodes having the irregularity structures at side walls thereof, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 8 illustrate sequential steps of a method for fabricating capacitors of a semiconductor device in accordance with an embodiment of the present invention, respectively.

Figure 1:
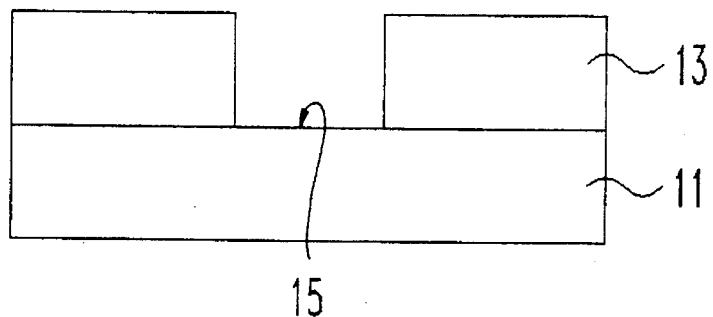
FIGS. 1 to 8 are sectional views respectively illustrating a method for fabricating capacitors of a semiconductor device in accordance with the present invention.

In accordance with the method of the present invention, a semiconductor substrate 11 is prepared and then a lower insulating layer 13 is formed on the semiconductor substrate 11, as shown in FIG. 1. The lower insulating layer 13 includes an element-isolating insulating film (not shown), a gate electrode (not shown) and an impurity-diffused region (not shown). Thereafter, the lower insulating layer 13 is etched in accordance with an etch process using a contact mask (not shown), thereby forming a contact hole 15. Through the contact hole 15, the semiconductor substrate 11 is exposed at its desired portion.

Over the resulting structure, a first amorphous silicon layer is formed, which is in contact with the semiconductor substrate 11 through the contact hole 15. The first amorphous silicon layer has a multi-layer structure including alternating doped and undoped amorphous silicon films 17 and 19. Each doped amorphous silicon film 17 is doped with n-type impurity ions in a high concentration. The multi-layer structure of the first amorphous silicon layer has desired numbers and thicknesses of doped and undoped amorphous silicon films 17 and 19. The uppermost portion of the first multi-amorphous silicon layer is formed of a doped amorphous silicon film.

The formation of doped and undoped amorphous silicon films 17 and 19 is carried out using a silicon source gas such as $SiH_4$, $Si_2H_6$ or $Si_3H_8$ and an impurity source gas such as $PH_3$ gas at a temperature of 450° to 550° C. in an in-situ manner in accordance with a low pressure chemical vapor deposition (LPCVD) method. In this case, on-off flow of the $PH_3$ gas is controlled in an in-situ manner. In the case of the $PH_3$ gas, phosphorous contained in the $PH_3$ gas is used as an impurity.

The formation of doped and undoped amorphous silicon films 17 and 19 may also be carried out in accordance with a plasma enhanced chemical vapor deposition (PECVD) method. In this case, the amorphous silicon films 17 and 19 are formed using different deposition appliances, respectively.

Figure 2:
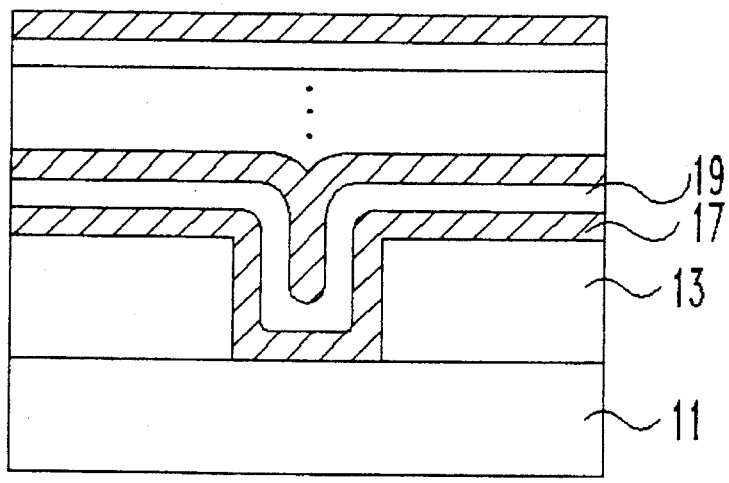
Figure 3:
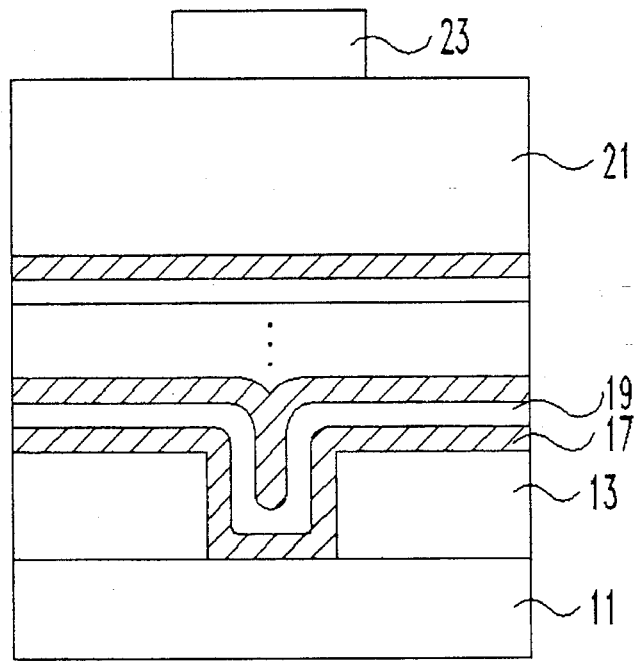

Over the doped first amorphous silicon film 17 which is the uppermost film of the structure shown in FIG. 2, an oxide film 21 is then formed, as shown in FIG. 3. The oxide film 21 is made of an oxide exhibiting a higher etch rate than that of the lower insulating layer 13. For example, where the lower insulating layer 13 is made of a high temperature oxide (HTO), the oxide film 21 is made of a phosphor silicate glass (PSG). The oxide film 21 has a thickness larger than the total thickness of the first amorphous silicon films 17 and 19. Subsequently, a photoresist film pattern 23 is formed on the oxide film 21 in accordance with an etch process using a storage electrode mask (not shown).

Figure 4:
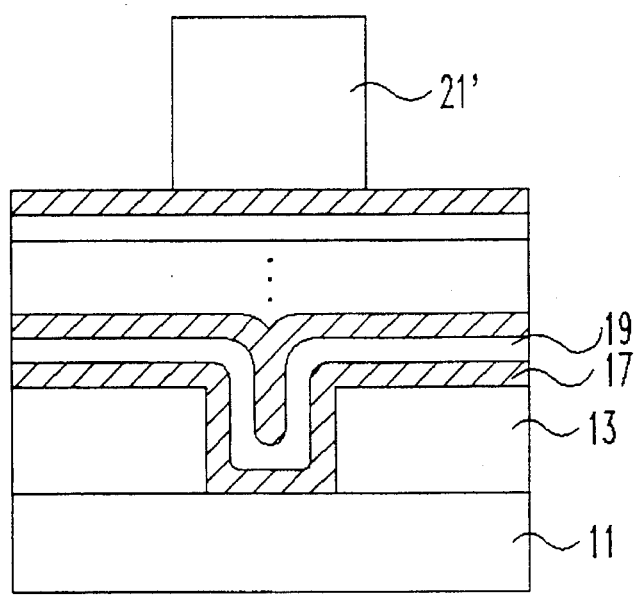

Using the photoresist film pattern 23 as a mask, the oxide film 21 is then etched, thereby forming an oxide film pattern 21', as shown in FIG. 4. Thereafter, the photoresist film pattern 23 is removed.

Figure 5:
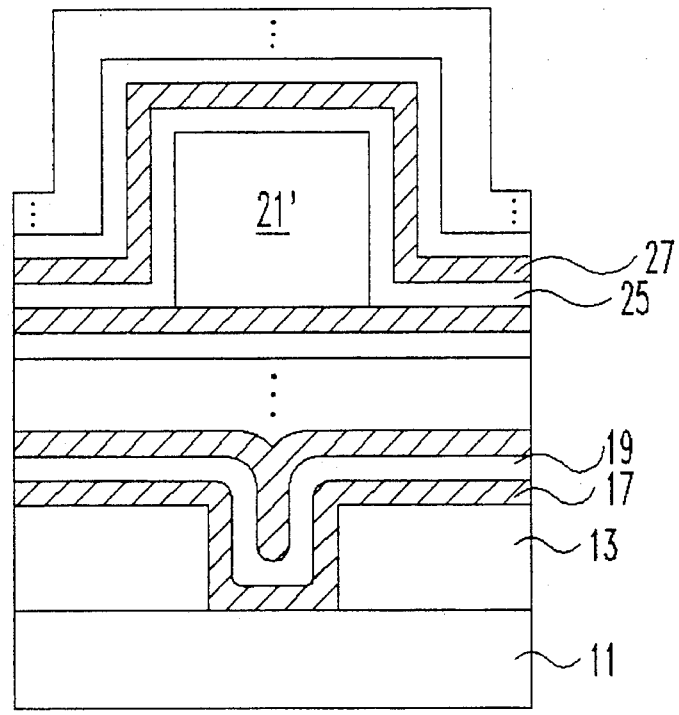

Over the resulting structure, a second amorphous silicon layer is formed, as shown in FIG. 5. The second amorphous silicon layer has a multi-layer structure being formed of alternating undoped and doped amorphous silicon films 25 and 27. Each doped amorphous silicon film 27 is doped with n-type impurity ions in a high concentration. The formation of the amorphous silicon films 25 and 27 is carried out in the same manner as that of the amorphous silicon films 17 and 19. The multi-layer structure of the second amorphous silicon layer has desired numbers and thicknesses of undoped and doped amorphous silicon films 25 and 27. The numbers and thicknesses of undoped and doped amorphous silicon films 25 and 27 are determined, taking into consideration the distance from cells disposed adjacent thereto. In particular, the total thickness of the second amorphous silicon films 25 and 27 should be smaller than ½ of the distance from cells disposed laterally adjacent thereto in order to prevent them from forming a short circuit with the adjacent cells.

Figure 6:
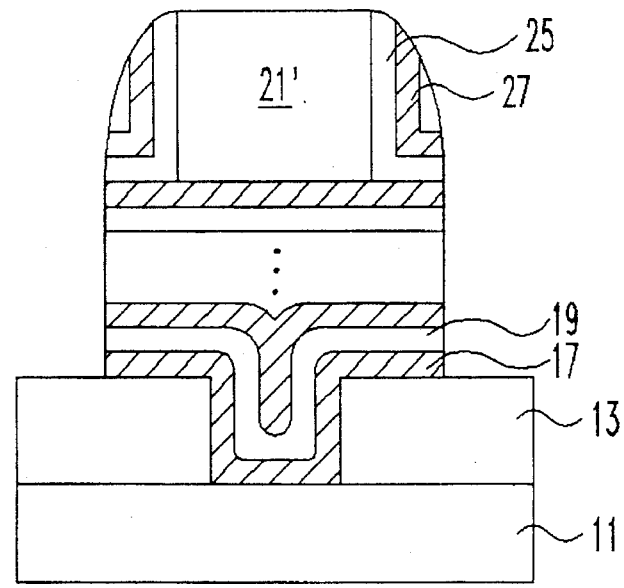

The multi-layer structure of the second amorphous silicon films 25 and 27 is then etched at its full surface by its thickness in accordance with a dry etch process in order to expose the oxide film pattern 21', as shown in FIG. 6. Thereafter, the multi-layer structure of the first amorphous silicon films 17 and 19 is etched at its full surface, thereby exposing the lower insulating layer 13. In this case, the oxide film pattern 21' is hardly etched because it exhibits a high difference in etch selectivity ratio from those of the amorphous silicon films 17, 19, 25 and 27. Accordingly, the oxide film pattern 21' serves as a mask.

Figure 7:
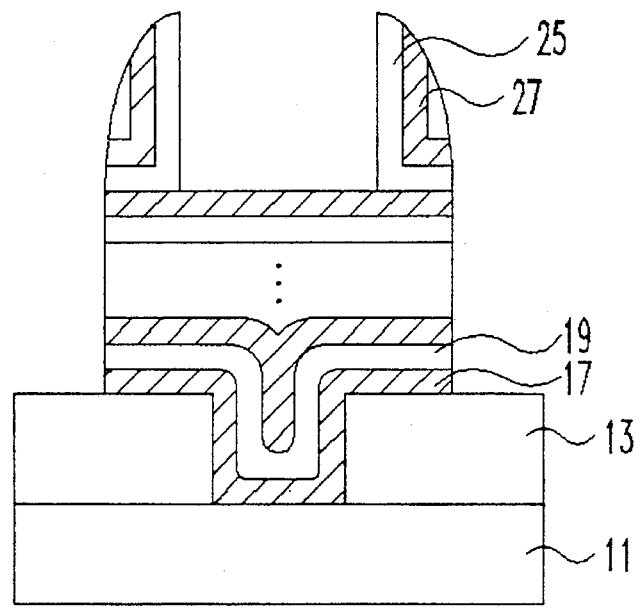

Subsequently, the oxide film pattern 21' is removed in accordance with a wet etch process using the difference in etch selectivity ratio between the oxide film pattern 21' and the amorphous silicon films 17, 19, 25 and 27, as shown in FIG. 7. In this case, the removal of the oxide film pattern 21' is carried out using a hydrofluorine (HF) solution or a buffered oxide etchant (BOE) solution.

Figure 8:
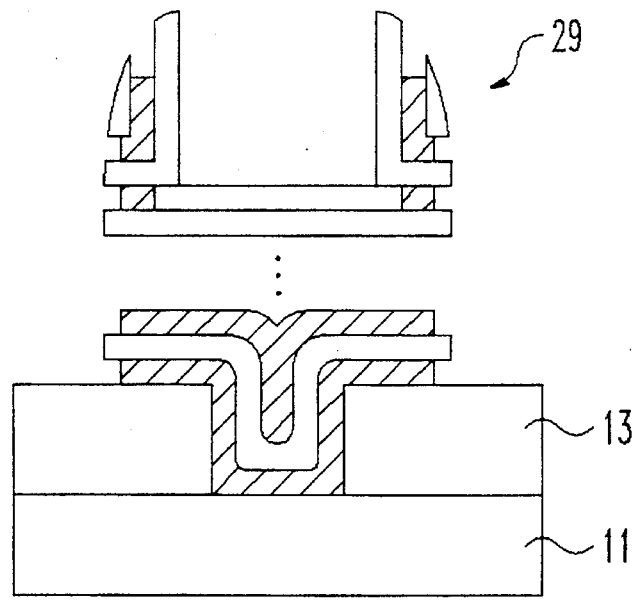

The overall structure shown in FIG. 7 is then annealed at a temperature ranging from 600° C. to 700° C. in an inert gas atmosphere for 30 minutes to 5 hours, as shown in FIG. 8. By the annealing, impurities contained in the doped amorphous silicon films 17 and 27 are activated. During this procedure, the amorphous silicon films 17, 19, 25 and 27 are crystallized into polysilicon.

As a result, the overall structure of the polysilicon films 17, 19, 25 and 27 layered on the semiconductor substrate 11 have a cylindrical shape.

Thereafter, the doped polysilicon films 17 and 27 are etched over a desired width using the difference in etch selectivity ratio thereof, as shown in FIG. 8. In this case, an $HNO_3/CH_3COOH/HF$ solution is used for the etching. As a result, the side walls of the cylindrical structure have irregularity including a plurality of pins. The resulting structure is subjected to a thermal process at a temperature ranging from 600° C. to 1,500° C. so that impurity ions contained in the polysilicon films 17 and 27 can be diffused in the polysilicon films 19 and 25, thereby doping those films 19 and 25. As a result, a cylindrical storage electrode 29 having an increased surface area is obtained.

The step of doping the polysilicon films 19 and 25 is carried out using $POCl_3$. Alternatively, phosphorous ions are doped in the polysilicon films 19 and 25 by flowing a $PH_3$ gas as the impurity source gas at a high temperature of 600° to 1.500° C.

At a subsequent step, a dielectric film (not shown) and plate electrode (not shown) are sequentially formed on the surface of the storage electrode. Thus, a capacitor having a sufficient capacitance for high integration of semiconductor devices is obtained. In this case, the dielectric film is made of a material exhibiting a superior dielectric characteristic. For example, the dielectric film has an NO or ONO composite structure. The plate electrode may be made of polysilicon, polycide or a conduction material similar thereto.

In accordance with the present invention, a multi-cylinder type storage electrode may be formed. In this case, several oxide films are formed by controlling the size of the oxide film 21 formed in accordance with the etch process using the storage electrode mask. As a result thereof, a storage electrode having two to four cylinders each having irregularity in a manner as mentioned above is formed.

Although the uppermost portion of the first amorphous silicon layer is formed of a doped amorphous silicon film, and the lowermost portions of the second amorphous silicon layer is formed of an undoped amorphous silicon film in accordance with the illustrated embodiment of the present invention, they may be formed in an opposite fashion to that in the above case.

As apparent from the above description, the present invention provides a method for fabricating capacitors of a semiconductor device, capable of forming a storage electrode provided at its side walls with irregularity providing an increased surface area in accordance with an etch process using a difference in etch selectivity ratio between doped and undoped silicon films, thereby not only obtaining a sufficient capacitance required for high integration of the semiconductor device, but also achieving an improvement in reliance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating capacitors of a semiconductor device comprising the steps of:

partially removing a lower insulating layer formed over a semiconductor substrate, thereby forming a contact hole, through which a portion of the semiconductor substrate is exposed;

forming doped amorphous conduction films and undoped amorphous conduction films in an alternating manner over the resulting structure obtained after forming the contact hole, thereby forming a first amorphous conduction layer having a multi-layer structure such that an uppermost one of the doped amorphous conduction films constitutes an uppermost portion of the multi-layer structure;

forming an insulating film pattern on the uppermost doped amorphous conduction film in accordance with an etch process using a storage electrode mask;

forming undoped amorphous conduction films and doped amorphous conduction films in an alternating manner over the resulting structure obtained after forming the insulating film pattern, thereby forming a second amorphous conduction layer;

etching the first and second amorphous conduction layers under a condition that the insulating film pattern and lower insulating layer are used as an etch barrier;

removing the insulating film pattern in accordance with a wet etch process;

annealing the first and second amorphous conduction layers, thereby forming first and second crystallized conduction layers without diffusing an impurity;

etching doped portions of the first and second crystallized conduction layers with a wet etch process, thereby providing an irregularity structure at the first and second crystallized conduction layers; and doping impurity ions in undoped portions of the first and second crystallized conduction layers, thereby forming a cylindrical storage electrode having the irregularity structure at each side wall thereof.

2. The method in accordance with claim 1, wherein the undoped films of the first and second amorphous conduction layers are formed in an atmosphere of a silicon source gas in accordance with a low pressure chemical vapor deposition method.

3. The method in accordance with claim 2, wherein the silicon source gas is $SiH_4$, $Si_2H_6$ or $Si_3H_8$.

4. The method in accordance with claim 1, wherein the doped films of the first and second amorphous conduction layers are formed in an atmosphere of a silicon source gas along with $PH_3$ as an impurity source gas in accordance with a low pressure chemical vapor deposition method.

5. The method in accordance with claim 1, wherein the films of the first and second amorphous conduction layers are formed in accordance with a plasma enhanced chemical vapor deposition method.

6. The method in accordance with claim 1, wherein the insulating film pattern is comprised of an oxide film exhibiting a etch rate higher than that of the lower insulating layer.

7. The method in accordance with claim 1, wherein the lower insulating layer comprises a high temperature oxide, and the insulating film pattern comprises a phosphor silicate glass.

8. The method in accordance with claim 1, wherein the insulating film pattern has a thickness larger than that of the first amorphous conduction layer.

9. The method in accordance with claim 1, wherein the second amorphous conduction layer has a thickness smaller than ½ of its distance from cells disposed adjacent thereto.

10. The method in accordance with claim 1, wherein the step of doping impurity ions in undoped portions of the first and second crystallized conduction layers comprises the step of flowing an impurity toward the undoped portions at a temperature ranging from 600° C. to 1,500° C.

11. The method in accordance with claim 1, wherein the step of doping impurity ions in undoped portions of the first and second crystallized conduction layers comprises the step of doping $POCl_3$ in the undoped portions.

12. The method in accordance with claim 1, wherein the uppermost portion of the first amorphous conduction layer comprises the undoped amorphous conduction film.

13. The method in accordance with claim 1, wherein the lowermost portion of the second amorphous conduction layer comprises the doped amorphous conduction film.

14. The method in accordance with claim 1, wherein the wet etch process used for the doped portions of the first and second crystallized conduction layers comprises the step of etching the doped portions by an $HNO_3/CH_3COOH/HF$ solution in accordance with their difference in etch selectivity ratio from the undoped portions of the first and second crystallized conduction layers.

15. A method for fabricating capacitors of a semiconductor device comprising the steps of:

partially removing a lower insulating layer formed over a semiconductor substrate, thereby forming a contact hole, through which a portion of the semiconductor substrate is exposed;

forming doped amorphous conduction films and undoped amorphous conduction films in an alternating manner over the resulting structure obtained after forming the contact hole, thereby forming a first amorphous conduction layer having a multi-layer structure such that an uppermost one of the doped amorphous conduction films constitutes an uppermost portion of the multi-layer structure;

forming a plurality of insulating film patterns on the uppermost doped amorphous conduction film in accordance with an etch process using a storage electrode mask;

forming undoped amorphous conduction films and doped amorphous conduction films in an alternating manner over the resulting structure obtained after forming the insulating film patterns, thereby forming a second amorphous conduction layer;

etching the first and second amorphous conduction layers under a condition that the insulating film patterns and lower insulating layer are used as an etch barrier;

removing the insulating film patterns in accordance with an wet etch process;

annealing the first and second amorphous conduction layers, thereby forming first and second crystallized conduction layers without diffusing an impurity;

etching doped portions of the first and second crystallized conduction layers with a wet etch process, thereby providing irregularity structures at the first and second crystallized conduction layers; and doping impurity ions in undoped portions of the first and second crystallized conduction layers, thereby forming multi-cylinder storage electrodes having the irregularity structures at side wall thereof, respectively.

16. The method in accordance with claim 15, wherein the number of the insulating film patterns is 2 to 4.

* * * * *